United States Patent
Ratnakumar et al.

(10) Patent No.: US 8,138,791 B1
(45) Date of Patent: Mar. 20, 2012

(54) STRESSED TRANSISTORS WITH REDUCED LEAKAGE

(75) Inventors: Albert Ratnakumar, San Jose, CA (US); Jun Liu, Santa Clara, CA (US); Jeffrey Xiaoqi Tung, Milpitas, CA (US); Qi Xiang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 60 days.

(21) Appl. No.: 12/694,603

(22) Filed: Jan. 27, 2010

(51) Int. Cl.
*H03K 19/177* (2006.01)

(52) U.S. Cl. ............. 326/45; 257/348; 257/418; 438/50

(58) Field of Classification Search ................. 326/45; 257/19, 348, 418; 438/50
See application file for complete search history.

(56) References Cited

U.S. PATENT DOCUMENTS

| | | | |
|---|---|---|---|
| 6,621,131 B2 | 9/2003 | Murthey et al. | |
| 6,806,180 B2 * | 10/2004 | Cho et al. | 438/618 |
| 6,867,433 B2 | 3/2005 | Yeo et al. | |
| 6,870,179 B2 | 3/2005 | Shaheed et al. | |
| 6,882,025 B2 | 4/2005 | Yeo et al. | |
| 6,884,667 B1 * | 4/2005 | Doris et al. | 438/164 |
| 7,060,549 B1 * | 6/2006 | Craig et al. | 438/199 |
| 7,384,833 B2 | 6/2008 | Polishchuk et al. | |
| 7,839,674 B2 * | 11/2010 | Lowrey et al. | 365/163 |
| 2005/0023633 A1 * | 2/2005 | Yeo et al. | 257/500 |
| 2005/0062497 A1 * | 3/2005 | Pellizzer et al. | 326/41 |
| 2005/0285202 A1 * | 12/2005 | Huang et al. | 257/368 |
| 2006/0097240 A1 * | 5/2006 | Lowrey et al. | 257/5 |
| 2007/0146012 A1 * | 6/2007 | Murphy et al. | 326/99 |
| 2007/0187770 A1 * | 8/2007 | Ahn et al. | 257/369 |
| 2007/0290192 A1 * | 12/2007 | Rotondaro | 257/19 |
| 2008/0280391 A1 | 11/2008 | Shin et al. | |
| 2009/0294868 A1 * | 12/2009 | Griebenow et al. | 257/369 |
| 2009/0321831 A1 * | 12/2009 | Cai et al. | 257/348 |
| 2010/0117158 A1 * | 5/2010 | Koide | 257/369 |

OTHER PUBLICATIONS

"Stretching silicon mobility with strain engineering" [online]. ElectroIQ [retrieved on Nov. 20, 2009]: <http://www.electroiq.com/index/display/semiconductors-article-display/286440/articles/solid-state-technology/volume-50/issue-3/departments/emerging-technology/stretching-silicon-mobility-with-strain-engineering.html>.
Liu, Jun, et al. U.S. Appl. No. 12/561,236, filed Sep. 16, 2009.

* cited by examiner

*Primary Examiner* — Jason M Crawford
(74) *Attorney, Agent, or Firm* — Treyz Law Group; Jason Tsai

(57) ABSTRACT

Integrated circuits with stressed transistors are provided. Stressing transistors may increase transistor threshold voltage without the need to increase channel doping. Stressing transistors may reduce total leakage currents. It may be desirable to compressively stress N-channel metal-oxide-semiconductor (NMOS) transistors and tensilely stress P-channel metal-oxide-semiconductor (PMOS) transistors to reduce leakage currents. Techniques that can be used to alter the amount of stressed experienced by transistors may include forming a stress-inducing layer, forming a stress liner, forming diffusion active regions using silicon germanium, silicon carbon, or standard silicon, implementing transistors in single-finger instead of multi-finger configurations, and implanting particles. Any combination of these techniques may be used to provide appropriate amounts of stress to increase the performance or decrease the total leakage current of a transistor.

17 Claims, 13 Drawing Sheets

STRESSED TRANSISTORS WITH REDUCED LEAKAGE

BACKGROUND

This relates generally to integrated circuits, and more particularly, to circuitry such as memory circuitry that may incorporate stressed transistors.

There is a trend with each successive generation of integrated circuit technology to scale transistors to smaller sizes, smaller threshold voltages, and smaller power supply voltages. Made properly, these adjustments allow improved performance and lowered costs. Care must be taken, however, to avoid issues such as excessive power consumption.

One aspect of lowering power consumption on an integrated circuit relates to transistor leakage currents. Leakage currents are undesired currents that flow between the terminals of a transistor during operation. An ideal transistor would exhibit no leakage. In the real world, however, leakage currents are unavoidable and must be minimized as best possible. If leakage currents are too high, a circuit may exhibit unacceptably large static power consumption. Particularly in circuits with large numbers of transistors, such as modern integrated circuits that include memory cells, leakage current minimization can be highly beneficial.

A technique that has often been used to reduce transistor leakage currents involves forming transistors with increased threshold voltages. Transistors generally have four terminals. The four transistor terminals include a drain terminal, a gate terminal, a source terminal, and a bulk terminal. The total leakage current of a transistor includes current contributions from a source-drain leakage current and a bulk leakage current. The source-drain leakage current is an undesired leakage current that flows between the drain and source terminals. The bulk leakage current is an undesired leakage current that flows between the drain and bulk terminals (or between the source and bulk terminals).

At previous technology nodes (e.g., in circuits having transistors with gate lengths greater than 45 nm), increasing the threshold voltage of a transistor would reduce its total leakage current. This is because increases in the threshold voltage of a transistor tended to lower the source-drain leakage current significantly while causing only minimal increases in bulk leakage current. Because the decrease in source-drain leakage current is greater than the increase in bulk leakage current, total leakage current is reduced.

Increases to the threshold voltages of these transistors are typically achieved by increasing channel doping. For example, a pocket implant may be performed during fabrication of a transistor. The pocket implant introduces a high concentration of dopant into regions of the channel that are adjacent to the source and drain terminals and increases threshold voltage.

As transistors continue to scale to gate lengths below 45 nm, however, increasing threshold voltages in this way increases bulk leakage significantly. This increase in bulk leakage can be greater than the decrease in source-drain leakage. As a result, increasing transistor threshold voltages may lead undesired increases in total leakage currents.

It would therefore be desirable to be able to provide improved techniques for forming transistors with reduced leakage.

SUMMARY

Integrated circuits such as programmable integrated circuits may include different types of transistors. Some of the transistors may be designed to satisfy performance criteria (e.g., timing constraints for high-speed applications) while other transistors may be designed to exhibit reduced amounts of leakage current.

Transistors may be stressed by appropriate processing during fabrication. Stressing transistors in this way may create transistors with elevated threshold voltages. Stressing transistors instead of increasing channel doping may reduce total leakage currents.

Transistors such as n-channel metal-oxide-semiconductor (NMOS) devices and p-channel metal-oxide-semiconductor (PMOS) devices may be stressed using various techniques. One technique involves temporarily forming a stress-inducing layer over a transistor to build in stress into the channel of the transistor. Tensile and compressive stress-inducing layers may be used to introduce tensile or compressive stress into the channel of a device. The induced stress may be oriented along the direction of current flow through a transistor. If desired, stress memorization technique may be used to build in stress. With this type of approach, a transistor retains stress even though the stress-inducing layer is removed during processing.

Another technique involves forming a tensile or compressive stress liner over a transistor. Unlike temporary stress-inducing layers, the stress liner is not removed.

Transistors can also be formed using single-finger configurations instead of multi-finger configurations. Single-finger transistor arrangements may take advantage of the presence of shallow trench isolation (STI) structures surrounding each source-drain diffusion region to provide compressive stress in the channel of the devices.

Another stress-forming technique involves using certain desired materials to form transistor diffusion regions. Materials such as silicon germanium and silicon carbon may be used to form source-drain diffusion regions to provide compressive stress and tensile stress, respectively.

Another technique that may be used involves relaxing the stress provided by a stress liner. Ion implantation may be performed over transistors having stress liners. Implanting particles in this way may damage the lattice of the stress liners to lessen the amount of stress that is produced.

These techniques or combinations of these techniques may be used to alter the amount of stress experience by NMOS or PMOS transistors. Each technique that is used may contribute stress. For performance-driven devices, it may be desired to make NMOS transistors tensilely stressed (or at least less compressively stressed) and to make PMOS transistors compressively stressed (or at least less tensilely stressed). For low-leakage devices, it may be desirable to make NMOS transistors compressively stressed (or at least less tensilely stressed) and to make PMOS transistors tensilely stressed (or at least less compressively stressed).

Further features of the present invention, its nature and various advantages will be more apparent from the accompanying drawings and the following detailed description.

DETAILED DESCRIPTION

This relates to adjusting transistor stresses in integrated circuits such as integrated circuits that contain memory elements.

Integrated circuits that contain memory elements may include memory chips, digital signal processing circuits with memory arrays, microprocessors, application specific integrated circuits with memory arrays, programmable logic device integrated circuits or other programmable integrated circuits in which memory elements are used for configuration memory, or any other suitable integrated circuits.

Programmable integrated circuits such as programmable logic device integrated circuits use programmable memory elements to store configuration data.

During the programming of a programmable integrated circuit, configuration data is loaded into the memory elements. During operation of the programmable integrated circuit, each memory element provides a static output signal. The static output signals that are supplied by the memory elements serve as control signals. These control signals are applied to programmable logic on the integrated circuit to customize the programmable logic to perform a desired logic function.

Memory elements may be organized in arrays having numerous rows and columns. For example, memory array circuitry may be formed in hundreds or thousands of rows and columns on a programmable logic device integrated circuit. Programmable integrated circuit 10 of FIG. 1 is an example of an illustrative integrated circuit on which memory array circuitry may be formed.

Figure 1:
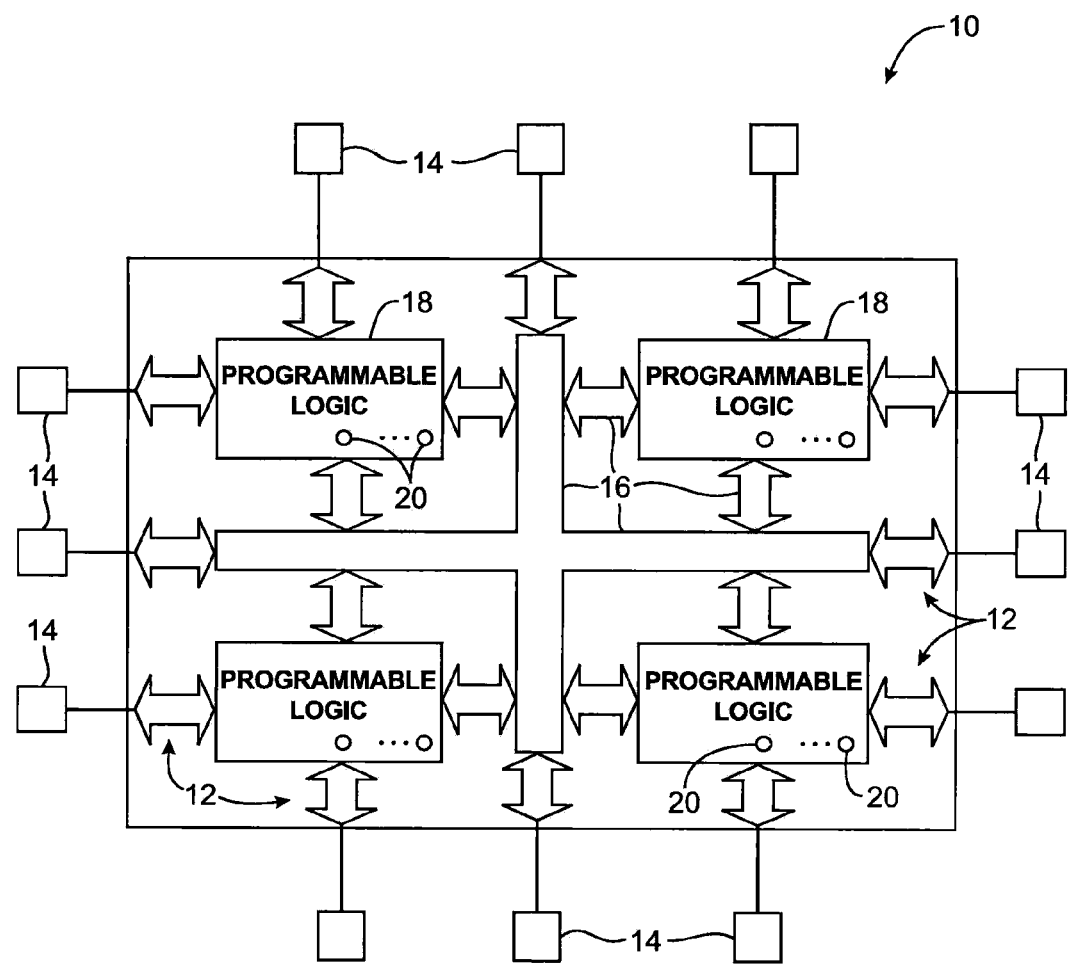
FIG. 1 is a diagram of an illustrative integrated circuit with an array of memory cells such as a programmable integrated circuit in accordance with an embodiment of the present invention.

As shown in FIG. 1, programmable integrated circuit 10 may have input/output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable integrated circuit 10 contains memory elements 20 that can be loaded with configuration data (also called programming data) using pins 14 and input/output circuitry 12. Once loaded, the memory elements each provide a corresponding static control output signal that controls the state of an associated logic component in programmable logic 18. Typically the memory element output signals are used to control the gates of metal-oxide-semiconductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

Figure 2:
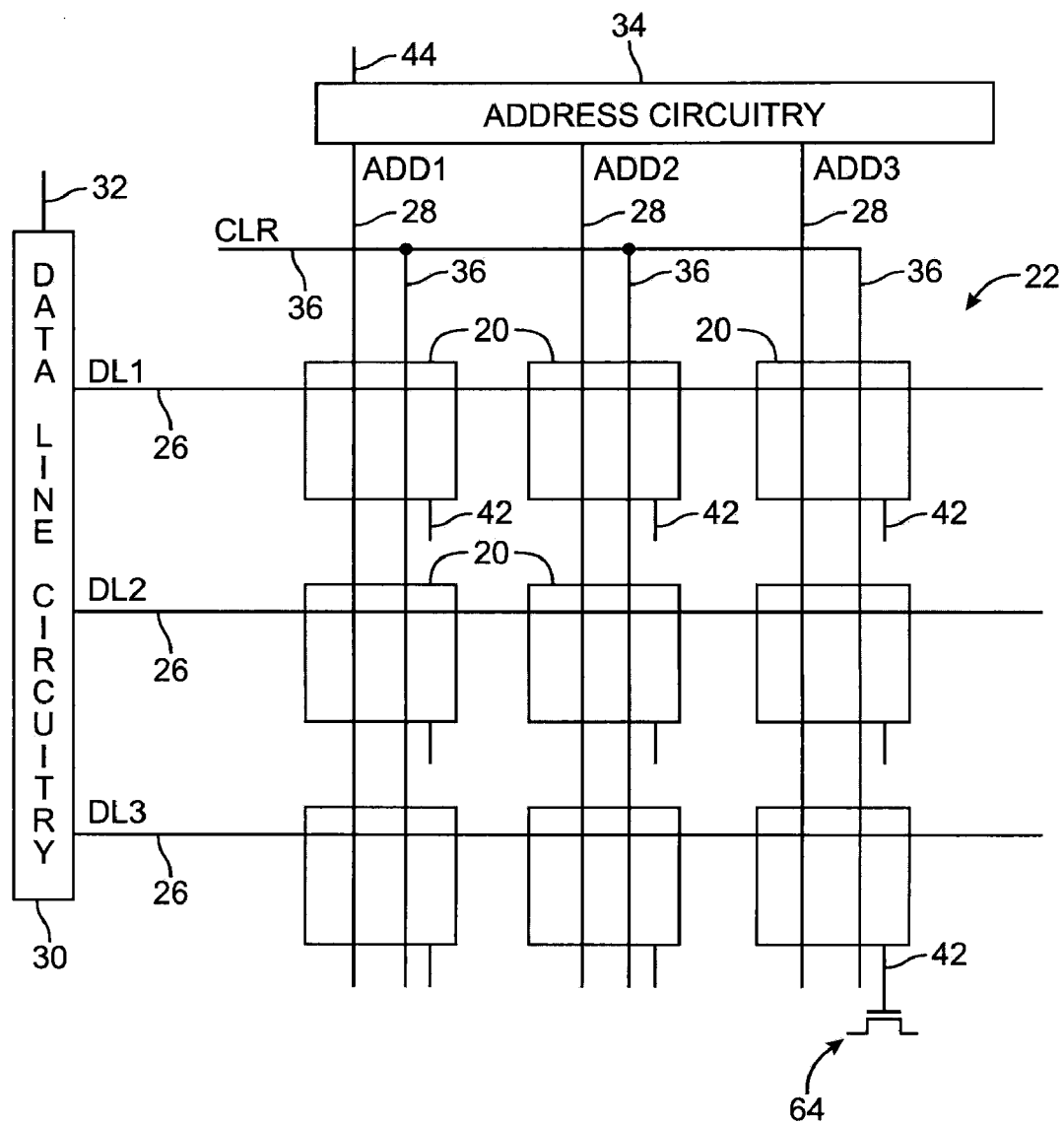
FIG. 2 is a diagram of an illustrative memory cell array with stressed transistors in accordance with an embodiment of the present invention.

When memory elements are arranged in an array, horizontal and vertical conductors and associated circuitry may be used to load the memory elements with configuration data and may be used to read data from the memory elements. An illustrative arrangement for data loading and data reading on integrated circuit 10 is shown in FIG. 2. The arrangement of FIG. 2 has a 3×3 array 22 of memory elements 20. Actual memory arrays typically have hundreds or thousands of rows and columns, but a 3×3 array is used as an example.

As shown in FIG. 2, a clear line 36 (labeled CLR) may be used to clear the contents of the memory array 22. After the array has been cleared, configuration data may be loaded. After configuration data has been loaded, the contents of memory elements 20 in array 22 may be read.

Configuration data may be provided in series to registers in data line circuitry 30 via input 32. During data writing operations, the configuration data may be provided in parallel to array 22 via the DL1, DL2, and DL3 data lines 26. During data read operations, data may be read from array 22 via the data lines 26.

Address decoder circuitry in address circuitry 34 may receive addressing information via input 44 during data writing and data reading operations. In response, the address decoder may assert a desired one of the address lines 28 (i.e., ADD1, ADD2, or ADD3). When an address line is asserted in a given column during data write operations, the data on the data lines 26 is loaded into the memory elements 20 in that column. The array may be filled by systematically loading the memory elements in each of the columns of the array. After the array has been completely loaded with configuration data, the static control output 42 of each memory element 20 produces a corresponding static control signal for controlling the gate of a pass transistor or other logic component on the programmable logic device (e.g., a pass transistor such as pass transistor 64). When an address line is asserted in a given column during data read operations, data from the memory elements in the addressed column is driven onto the data lines 26. Data line output latches and other read circuitry in data line circuitry 30 may be used in handling the data signals from data lines 26.

Figure 3:
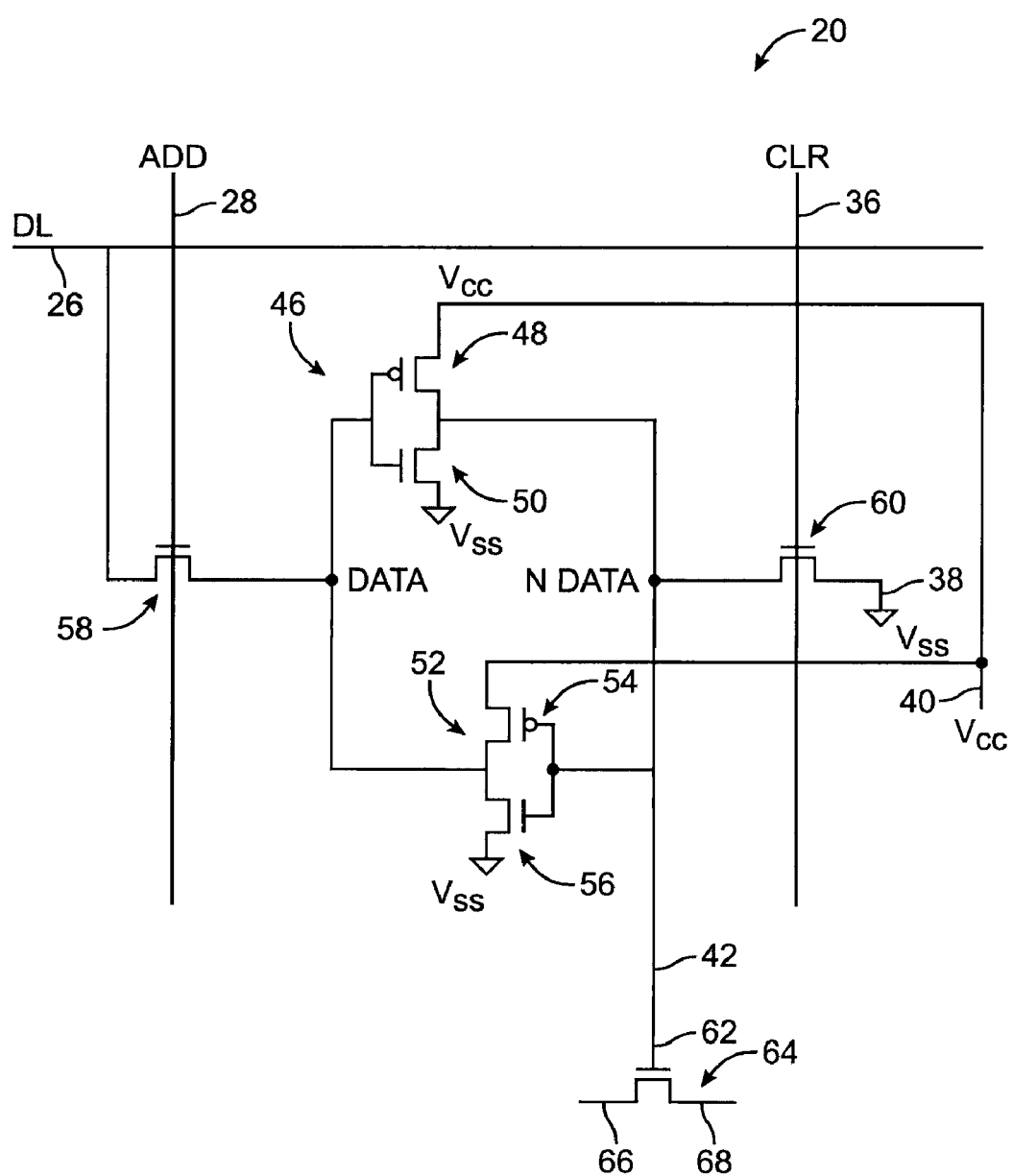
FIG. 3 is a diagram of an illustrative memory cell with stressed transistors in accordance with an embodiment of the present invention.

A memory element 20 of the type that may be used in array 22 of FIG. 2 is shown in FIG. 3. As shown in FIG. 3, the memory element 20 may be formed from two cross-coupled inverters—inverter 46 and inverter 52. The cross-coupled inverters form a storage element (latch) that allows memory element 20 to serve as a storage cell that stores configuration data. Inverter 46 may have a p-channel metal-oxide-semiconductor (PMOS) transistor 48 and an re-channel metal-oxide-semiconductor (NMOS) transistor 50. Inverter 52 may have a PMOS transistor 54 and NMOS transistor 56. The NMOS clear transistor 60 may be turned on during clear operations by activating clear line 36. This connects complementary data signal NDATA to ground 38 and clears the memory element 20. During normal operation, the value of the control signal on control output line 42 is determined by the value of the complementary data signal NDATA.

When address line 28 is taken high during a write operation, NMOS address transistor 58 is turned on and the signal DL on data line 26 is driven into the memory element 20. The stored data bit in memory element 20 is represented by signal DATA in FIG. 3 and is represented in complementary form by NDATA. If the signal on line 26 is high, signal DATA remains high and the memory element 20 remains in its cleared (erased) state. In the erased state, memory element 20 may be said to contain a logic low or a "zero" bit. The output NDATA on line 42 in this situation will be low. If the signal on line 26 is low during the write operation, DATA will be taken low and, due to the inversion of the low DATA signal by inverter 46, the signal NDATA will be taken high. This makes the output line 42 high. When DATA is low and NDATA is high, memory element 20 may be said to contain a "one" or logic high bit and may be referred to as being "programmed."

The NDATA control signal is applied to the gate 62 of pass transistor 64. When NDATA is low, pass transistor 64 is off. When NDATA is high, pass transistor 64 is on and data is allowed to flow between line 66 and line 68

Figure 4A:
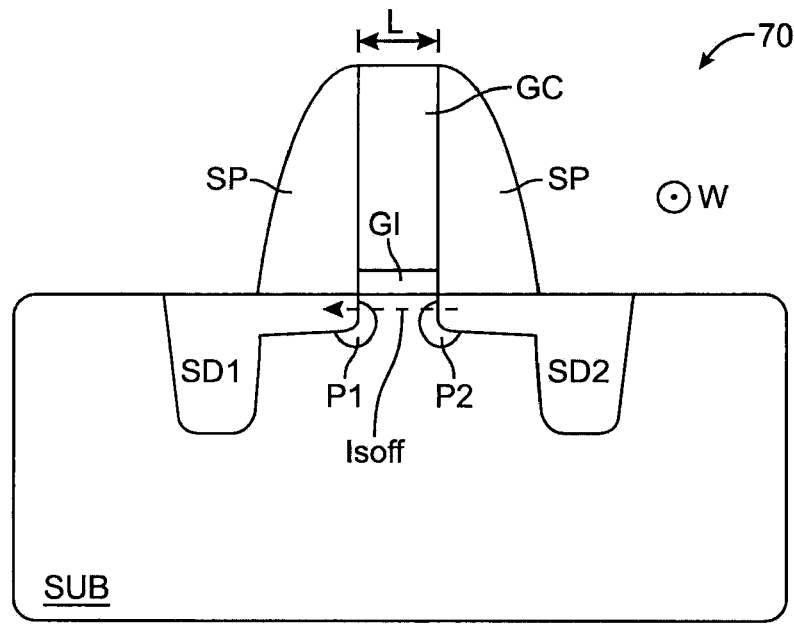
FIG. 4A is a cross-sectional side view of an illustrative transistor showing a source-drain leakage current that may be present during operation in accordance with an embodiment of the present invention.

An illustrative transistor of the type that may be used in integrated circuit 10 of FIG. 1 is shown in FIG. 4A. Transistor 70 may be an NMOS transistor (as an example). Transistor 70 may be formed in a substrate such as substrate SUB. Transistor 70 may have a gate such as gate conductor GC. Gate conductor GC may be formed over substrate SUB and may be formed using polysilicon, metal, or other suitable conductive materials. A gate insulator such as gate insulator GI may be formed between gate conductor GC and substrate SUB. Gate insulator GI may sometimes be referred to as gate oxide. Spacers such as spacers SP may flank either side of gate conductor GC for insulating purposes.

Transistor 70 may have source-drain diffusion regions such as diffusion regions SD1 and SD2. The diffusion regions may be formed in substrate SUB and below spacers SP. The region at the surface of substrate SUB that is directly beneath gate insulator GI and that lies between diffusion regions SD1 and SD2 is generally referred to as a channel. The channel may have a length indicated by gate length (or channel length) L. Length L extends parallel to the direction of current that flows between the source-drain diffusion regions. Transistor 70 also has a gate (channel) width W that is measured in a direction that points into the page (see, e.g., FIG. 4A).

Pocket implant regions such as pocket implant regions P1 and P2 may be formed near the channel and adjacent to diffusion regions SD1 and SD2, respectively. Pocket implant regions P1 and P2 may be formed using dopants of a different type than the dopants used to form diffusion regions SD1 and SD2. For example, pocket implant regions P1 and P2 may be formed using p-type dopants (e.g., boron, gallium, etc.) while diffusion regions SD1 and SD2 may be formed using n-type dopants (e.g., phosphorous, arsenic, etc.). The concentration of dopants in pocket implant regions P1 and P2 and diffusion regions SD1 and SD2 may be high. For example, the concentration of p-type dopants in pocket implant regions P1 and P2 may be $10^{19}$ boron atoms/cm$^3$, and the concentration of n-type dopants in diffusion regions SD1 and SD2 may be $10^{19}$ phosphorous atoms/cm$^3$. Pocket implant regions P1 and P2 and diffusion regions SD1 and SD2 with such high dopant concentrations may be referred to as "p+" and "n+" regions, respectively.

Transistor 70 may be placed in an off state by driving gate conductor GC to a low voltage. The voltage difference between gate conductor GC and diffusion region SD1 is generally less than the threshold voltage (Vth) of transistor 70 in the off state. In an ideal transistor, no current should flow between diffusion regions SD1 and SD2 in the off state. In practice, however, transistors may exhibit undesirable leakage currents that flow between the different regions (terminals) of the transistors. There may be a source-drain leakage current such as source-drain leakage current Isoff that flows from diffusion region SD1 to diffusion region SD2 if the voltage level at diffusion region SD2 is higher than the voltage level at diffusion region SD1. The direction of current flow shown in FIG. 4A refers to the direction of the flow of positively charged particles (holes). If the voltage level of diffusion region SD1 were higher than the voltage level of diffusion region SD2, the direction of source-drain leakage current Isoff would be reversed.

Figure 4B:
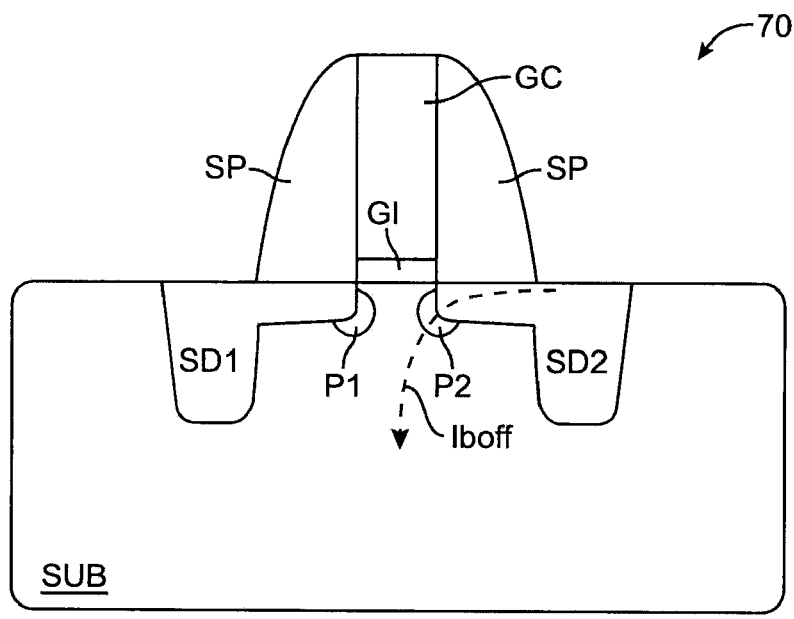
FIG. 4B is a cross-sectional side view of an illustrative transistor showing how the transistor may exhibit a bulk leakage current in accordance with an embodiment of the present invention.

The junction adjoining the p+ pocket implant regions and the n+ diffusion regions may sometimes be referred to as an abrupt junction. An abrupt junction is an interface between different types of highly doped regions (i.e., regions with high dopant concentrations). The presence of abrupt junctions in transistor 70 may cause current to flow from a diffusion region to substrate SUB. For example, there may be an undesired bulk leakage current Iboff that flows from diffusion region SD2 to substrate SUB of transistor 70, as shown in FIG. 4B. In this example, diffusion region SD2 has been raised to a voltage level that is higher than the voltage level of substrate SUB.

Transistor 70 of FIGS. 4A and 4B is merely illustrative. Source-drain leakage currents Isoff and bulk leakage currents Iboff are generally present in both NMOS and PMOS transistors. The sum of leakage currents Isoff and Iboff in a transistor is equal to total leakage current Ioff.

Figure 5A:
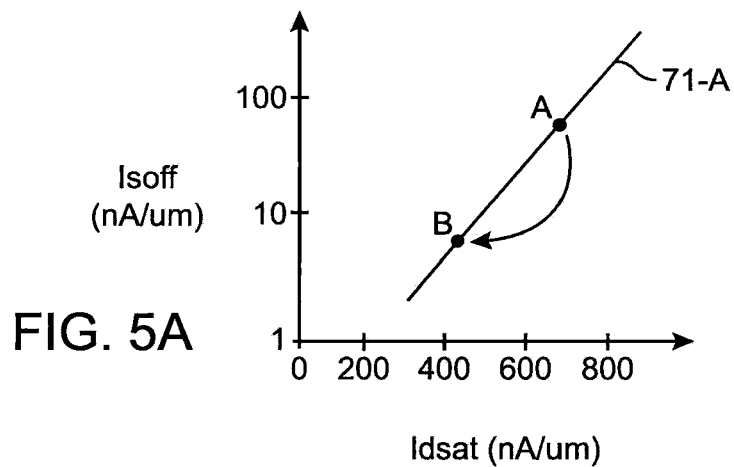
FIG. 5A is a graph of an illustrative characteristic curve showing how source-drain leakage current in a transistor may vary as a function of source-drain saturation current.

A common technique for reducing source-drain leakage currents Isoff in conventional transistors involves increasing a transistor's threshold voltage by increasing channel doping. Increasing threshold voltage in this way decreases source-drain leakage current Isoff at the cost of degraded source-drain saturation current Idsat, as shown in the characteristic curve of FIG. 5A. Characteristic curve 71-A may represent a general tradeoff characteristic between source-drain leakage current and saturation current. Saturation current Idsat is an "on current" that flows between diffusion regions SD1 and SD2 of a transistor in an on state (i.e., when the voltage difference between gate conductor GC and diffusion region SD1 is greater than the threshold voltage). As shown in FIG. 5A, the operating point of a transistor may, for example, be changed from point A to point B along characteristic curve 71-A by increasing the transistor's threshold voltage using conventional techniques such as pocket implants. Increasing threshold voltage may reduce source-drain leakage currents exponentially while only linearly decreasing saturation currents (e.g., device performance). Note that the y-axis of FIG. 5A is in logarithmic scale.

Figure 5B:
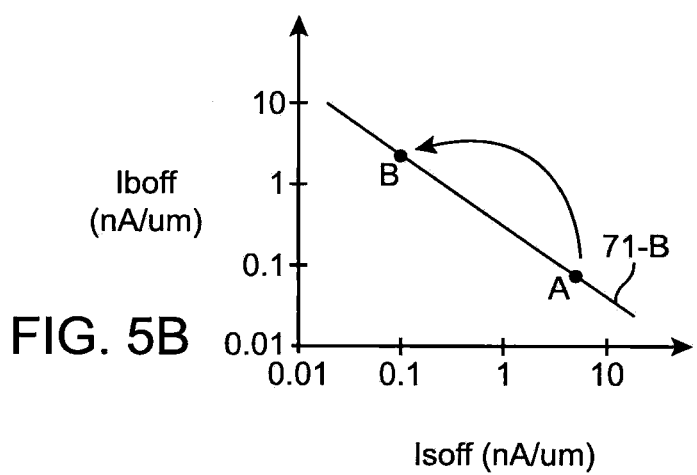
FIG. 5B is a graph of an illustrative characteristic curve showing how a transistor may exhibit a tradeoff between bulk leakage current and source-drain leakage current.

Decreasing source-drain leakage current Isoff in this way may may increase bulk leakage current Iboff, as shown in FIG. 5B. For example, the operating point of a transistor can be changed from point A to point B along characteristic curve 71-B. Characteristic curve 71-B may represent a general tradeoff characteristic between leakage currents Isoff and Iboff. Leakage currents Isoff and Iboff may vary linearly with respect to one another.

Figure 5C:
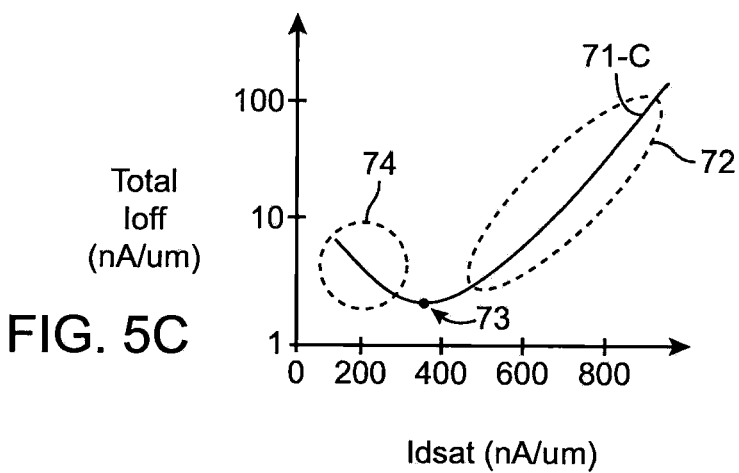
FIG. 5C is a graph of an illustrative curve showing how total leakage current may vary as a function of source-drain saturation current in conventional transistors and in transistors in accordance with an embodiment of the present invention.

FIG. 5C is a graph that plots total leakage current Ioff against saturation current Idsat. Characteristic curve 71-C may represent a general characteristic curve plotting the relationship between total leakage currents and saturation currents when adjusting the threshold voltage of a transistor through channel doping. A portion such as portion 72 of curve 71-C may represent an operating regime in which increasing threshold voltage successfully lowers total leakage current Ioff of a transistor. Increasing threshold voltages in this way may lower total leakage currents up to a certain point such as inflection point 73.

Portion 74 of curve 71-C represents an operating regime past inflection point 73 in which increasing threshold voltages through conventional channel doping techniques result in increases to total leakage currents. This undesirable increase in total leakage currents may be attributed to the increase in bulk leakage current Iboff described in connection with FIG. 5B. If points A and B lie in region 74 (as may be the case for technology nodes past 45 nm), increasing threshold voltage using conventional pocket implant techniques may result in undesired increases in total Ioff.

Figure 6A:
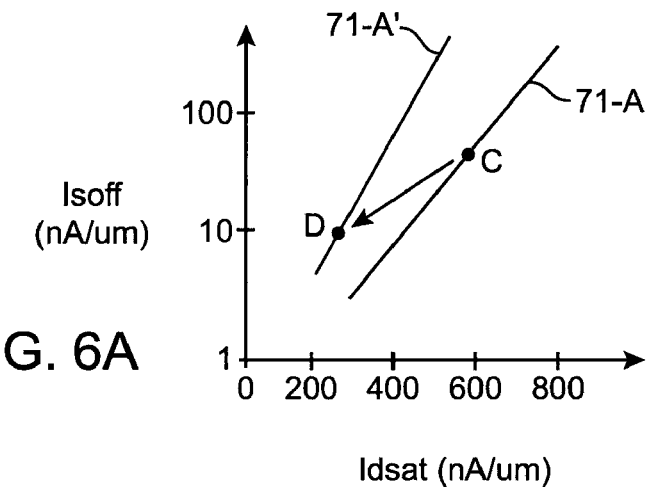
FIG. 6A is a graph showing how a characteristic curve of the type shown in connection with FIG. 5A can be shifted by using stressed transistors with a different amount of stress in accordance with an embodiment of the present invention.
Figure 6B:
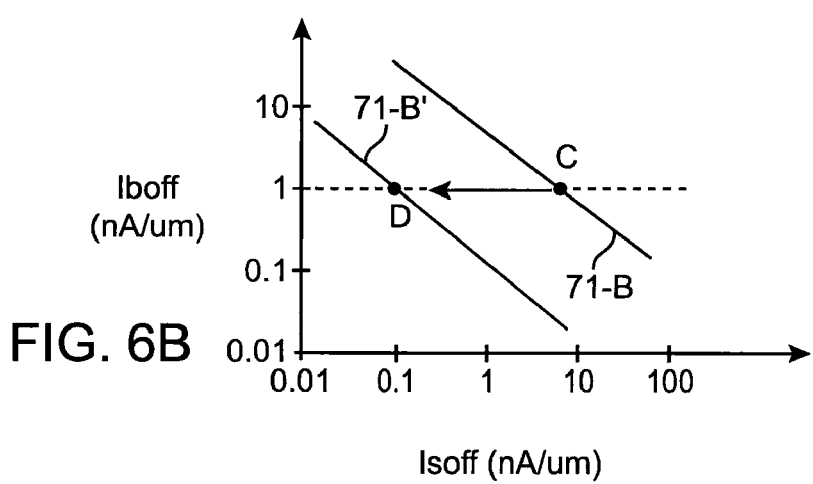
FIG. 6B is a graph showing how the characteristic curve of the type shown in connection with FIG. 5B can be shifted by using stressed transistors with a different amount of stress in accordance with an embodiment of the present invention.

To avoid these short comings of conventional techniques, stress may be used to shift characteristic curve 71-A to form characteristic curve 71-A' (as shown in FIG. 6A). Changing the operating point of a transistor from point C on curve 71-A to point D on curve 71-A' using transistor stress may decrease source-drain leakage current at the cost of reduced saturation current Idsat. As shown in FIG. 6B, stressing transistors appropriately may also shift characteristic curve 71-B of the type described in connection with FIG. 5B to form characteristic curve 71-B'. For example, changing the operating point of a transistor from point C on curve 71-B to point D on curve 71-B' may reduce source-drain leakage current Isoff while keeping bulk leakage Iboff at a constant level (e.g., 1 nA/μm in FIG. 6B). Stressing transistors in this way (i.e., shifting characteristic curve 71-B to the left) may therefore be able reduce total leakage current, because source-drain leakage current Isoff can be lowered without increasing bulk leakage current Iboff.

Figure 6C:
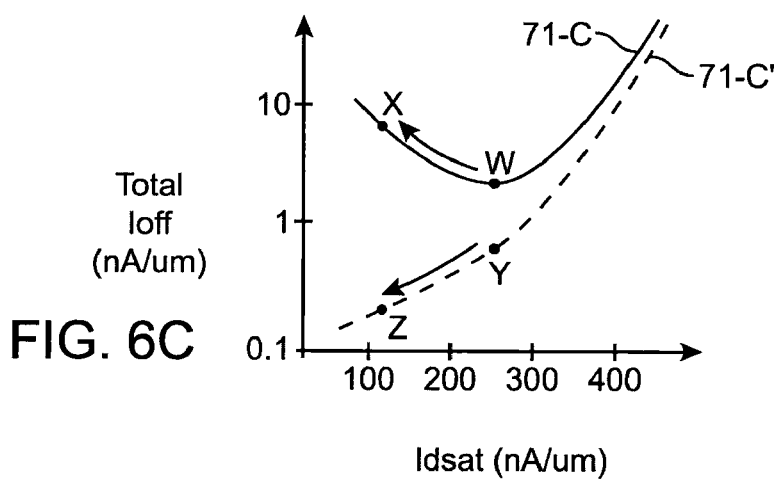
FIG. 6C is a graph showing how the curve of the type shown in connection with FIG. 5C can be altered by using stressed transistors with a different amount of stress in accordance with an embodiment of the present invention.

Stressed transistors may be able to provide improved total leakage current characteristics. FIG. 6C plots total leakage current Ioff as a function of saturation current Idsat. Stressing transistors with appropriate amounts of stress may shift characteristic curve 71-C of the type described in connection with FIG. 5C to form characteristic curve 71-C'. While curve 71-C for unstressed transistors may have an inflection point at which total leakage current starts to increase with further reduction in saturation current, curve 71-C' for stressed transistors may lack an inflection point. For example, point W on curve 71-C and point Y on curve 71-C' may represent operating points for unstressed and stressed transistors, respectively. Points W and Y may be at the same saturation current Idsat level. Point W may be moved to point X along conventional curve 71-C while point Y may be moved to point Z along stressed transistor curve 71-C'. The total leakage current corresponding to point X may be greater than the total leakage current of point W while the total leakage current corresponding to point Z may be less than the total leakage current of point Y. Stressing transistors may also increase threshold voltages and therefore allow total leakage currents to be further reduced without increasing channel doping.

Figure 7:
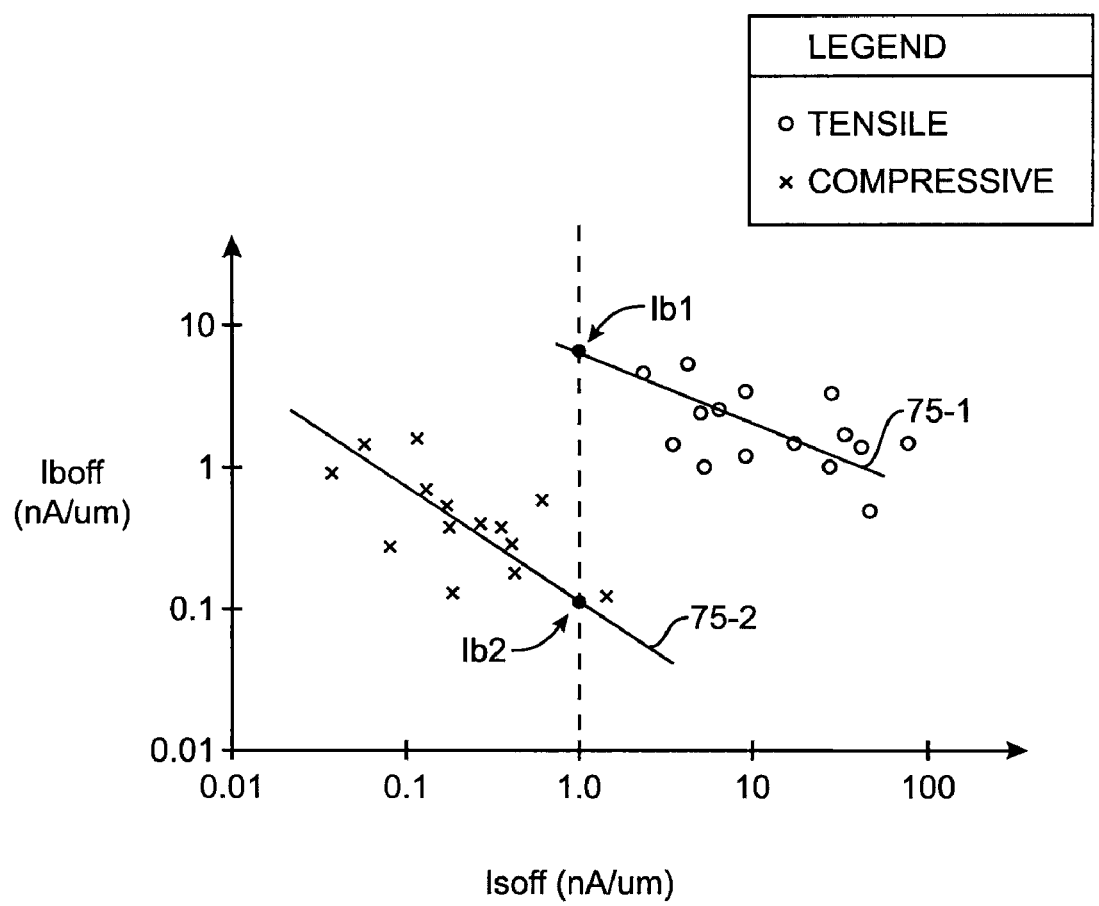
FIG. 7 is a graph of measured leakage currents showing tradeoffs between bulk leakage current and source-drain leakage current for tensilely stressed transistors and compressively stressed transistors in accordance with an embodiment of the present invention.

Different types of stress can be applied to a transistor. For example, an NMOS transistor may be placed under either tensile stress or compressive stress, as shown in FIG. 7. FIG. 7 shows characteristic curves 75-1 and 75-2 and corresponding measured data points that illustrate how bulk leakage current Iboff may vary with source-drain leakage current Isoff. Curve 75-1 may represent a general trend for tensilely stressed transistors, as indicated by symbols "o." Curve 75-2 may represent a general trend for compressively stressed transistors, as indicated by symbols "x." The "o" and "x" data points are scattered as shown in FIG. 7, because of the presence of random device parameter variation. Variation in gate lengths, threshold voltages, and other device parameters is a byproduct of non-ideal fabrication conditions.

Curve 75-2 (representing compressively stressed transistors) may be located to the left of curve 75-1 (representing tensilely stressed transistors). There may be a point on curve 75-1 such as point Ib1 and a point on curve 75-2 such as point Ib2 that have the same source-drain leakage current value. For example, points Ib1 and Ib2 may correspond to a source-drain leakage current value of 1 nA/μm. Point Ib1 may correspond to a bulk leakage current value of 5 nA/μm while point Ib2 may correspond to a bulk leakage current value of 0.1 nA/μm (as an example). Point Ib2 may have a bulk leakage current value that is 50 times (5 nA/μm divided by 0.1 nA/μm) lower than the bulk leakage current value of point Ib1 (for the same source-drain leakage current value). Point Ib2 may in general have a bulk leakage current value that is at least 10 times smaller than the bulk leakage current of point IB1 (for the same source-drain leakage current value).

As the results of FIG. 7 demonstrate, it may be desirable to form compressively stressed NMOS transistors in circuitry where minimizing leakage currents is a primary concern. Compressively stressed NMOS transistors will generally have lower total leakage currents than comparable (i.e., transistors having equal gate lengths and equal gate widths) tensilely stressed NMOS transistors and lower total leakage currents than comparable NMOS transistors with lesser amounts of compressive stress. Compressively stressed NMOS transistors may exhibit somewhat degraded switching speed performance (i.e., decreased saturation current per unit width), because compressively stressed NMOS transistors have degraded channel mobility (i.e., electron mobility) in comparison to tensilely stressed NMOS transistors and compared to NMOS transistors with lesser amounts of compressive stress. Nevertheless, decreased switching speed can be acceptable in many applications.

It may be similarly desirable to form tensilely stressed PMOS transistors for applications in which minimizing leakage currents is a crucial factor. Tensilely stressed PMOS transistors may have lower total leakage currents than compressively stressed PMOS transistors and than PMOS transistors with lesser amounts of tensile stress. Tensilely stressed PMOS transistors may exhibit somewhat degraded switching speed performance, because tensilely stressed PMOS transistors have degraded channel mobility (i.e., hole mobility) in comparison to compressively stressed PMOS transistors and to PMOS transistors with lesser amounts of tensile stress.

Figure 8:
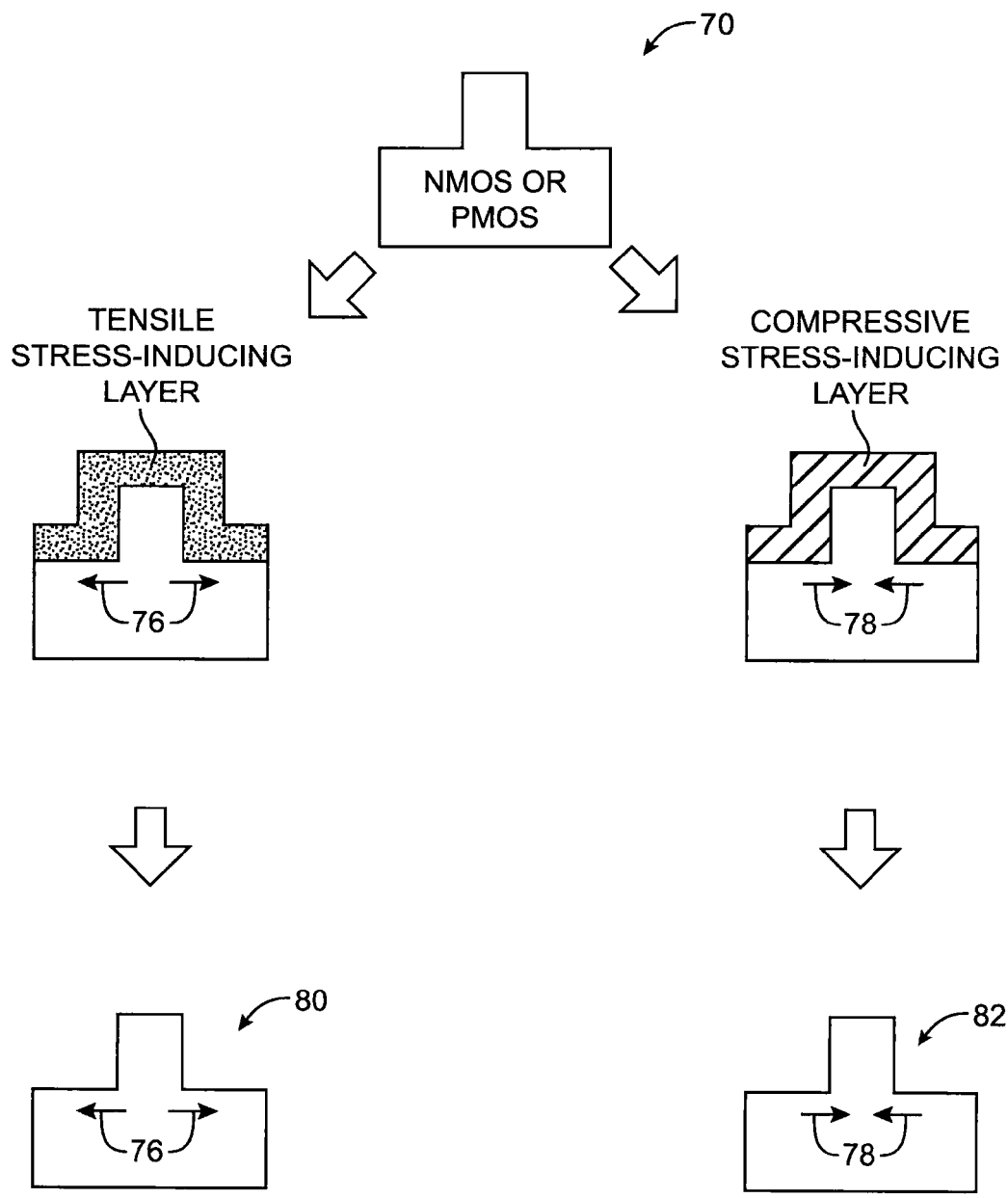
FIG. 8 is a diagram showing illustrative steps involved in using a stress memorization technique (SMT) to introduce stress into transistors in accordance with an embodiment of the present invention.

Any suitable fabrication technique may be used to form a stressed transistor. One way that may be used is sometimes referred to as a stress memorization technique (SMT). The use of this technique is illustrated in FIG. 8. The process that is used to form transistors such as NMOS or PMOS transistors 70 may be referred to as a CMOS (complementary metal-oxide-semiconductor) process. During the CMOS fabrication process, the gate conductor of transistor 70 may be amorphized and a stress-inducing layer such as a tensile stress-inducing layer or a compressive stress-inducing layer may be formed over transistor 70. A stress-inducing layer (tensile or compressive) may sometimes be referred to as a "cap layer." Transistor 70 may undergo an annealing process while the stress-inducing layer is still covering transistor 70.

A tensile stress-inducing layer may build in tensile stress in the channel of transistor 70, as indicated by the direction of arrows 76. Arrows 76 are parallel to the direction of the transistor's channel length. A compressive stress-inducing layer may build in compressive stress in the channel, as indicated by the direction of arrows 78. The direction of stress described herein may be along the direction of current flow through a transistor (e.g., arrows 76 and 78 are parallel to the direction of saturation current flow). The stress-inducing layer may be removed after the annealing process. Stress may remain present (stored) after the removal of the stress-inducing layer. A transistor with tensile stress-inducing layer removed such as transistor 80 may therefore have built-in tensile stress along its gate length. A transistor with compressive stress-inducing layer removed such as transistor 82 may have built-in compressive stress along its gate length.

Figure 9:
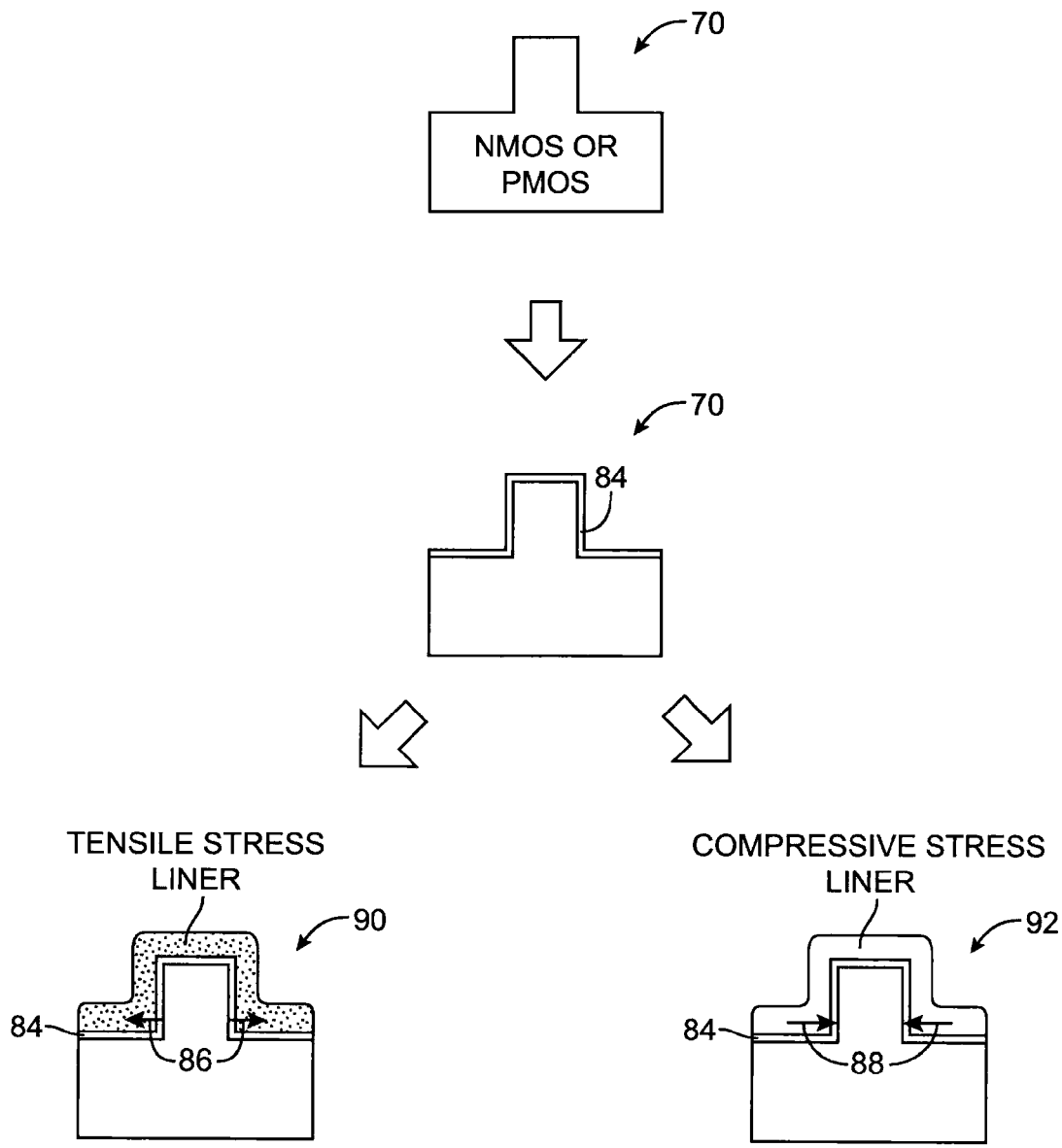
FIG. 9 is a diagram showing illustrative steps involved in forming a stress liner over a transistor in accordance with an embodiment of the present invention.

Stressing transistors using a stress memorization technique is merely one illustrative method of introducing stress. Another technique involves forming a stress liner over transistor 70, as shown in FIG. 9. Illustrative transistor 70 may be an NMOS transistor or a PMOS transistor. Stress liners may be formed prior to etching contact holes during the CMOS process. For example, a protective liner such as liner 84 may be deposited over transistor 70. Liner 84 may be formed using silicon nitride or other suitable etch-stop materials. A tensile stress liner or a compressive stress liner may then be formed over transistor 70. Stress liners may also be formed using nitride or other suitable materials. A tensile stress liner may provide tensile stress in the channel in the direction of arrows 86 (i.e., parallel to the length of the transistor) to form tensilely stressed transistor 90. A compressive stress liner may provide compressive stress in the channel in the direction of arrows 88 to form compressively stress transistor 92.

Figure 10:
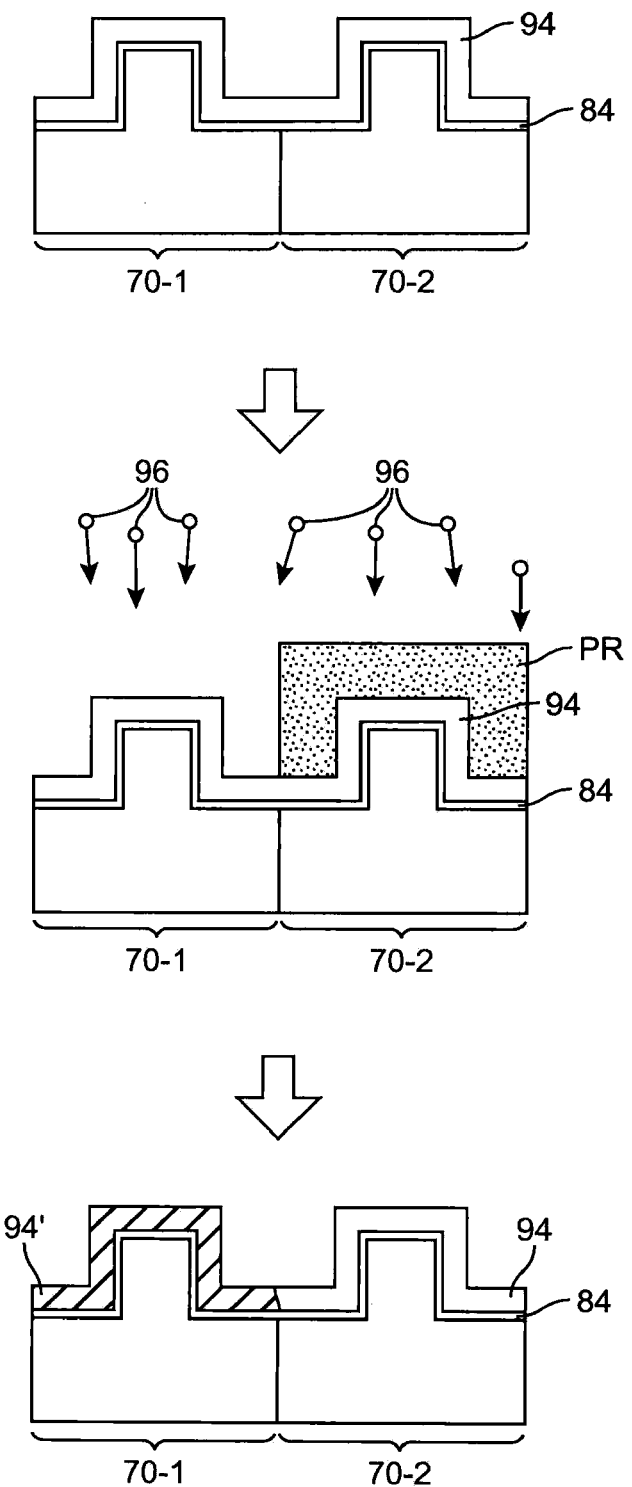
FIG. 10 is a diagram showing how particles may be implanted to selectively relax stress in stress liners in accordance with an embodiment of the present invention.

It may sometimes be desirable to alter the amount of stress provided by a stress liner. Particles may be selectively implanted (e.g., ion implantation) into transistors to relax the amount of stress in the stress liner, as shown in FIG. 10. Consider a scenario in which there are two adjacent transistors 70-1 and 70-2. Protective liner 84 and stress liner 94 may be deposited over transistors 70-1 and 70-2. Stress liner 94 may be a tensile stress liner (as an example). It may be desirable to reduce the amount of tensile stress in transistor 70-1. A photoresist layer such as photoresist layer PR may be selectively deposited over transistor 70-2. Photoresist layer PR may leave transistor 70-1 exposed (see, e.g., FIG. 10). Particles such as argon atoms 96 may be implanted over transistors 70-1 and 70-2 while photoresist layer PR is still intact. Other suitable types of particles or ions may be implanted, if desired. Photoresist layer PR may serve to absorb the implanted particles such that the particles have no effect on the transistors that layer PR covers (e.g., transistor 70-2). Because transistor 70-1 is exposed to the incoming particles, the particles may damage stress liner 94 upon impact.

The portion of stress liner 94 that is not covered by photoresist layer PR during implantation may become a more relaxed stress liner such as stress liner 94' (see, e.g., FIG. 10). In this example, stress liner 94' may produce less tensile stress in comparison to stress liner 94. This technique may also be applied to compressive stress liners. In another suitable arrangement, stress liner 94 may be a compressive stress liner. Transistor 70-2 may be protected by photoresist layer PR during the implantation process. Bombarding transistors 70-1 and 70-2 with incoming particles in this way may create a more relaxed stress liner 94'. Exposed stress liner 94' may have less compressive stress than original stress liner 94.

Figure 11A:
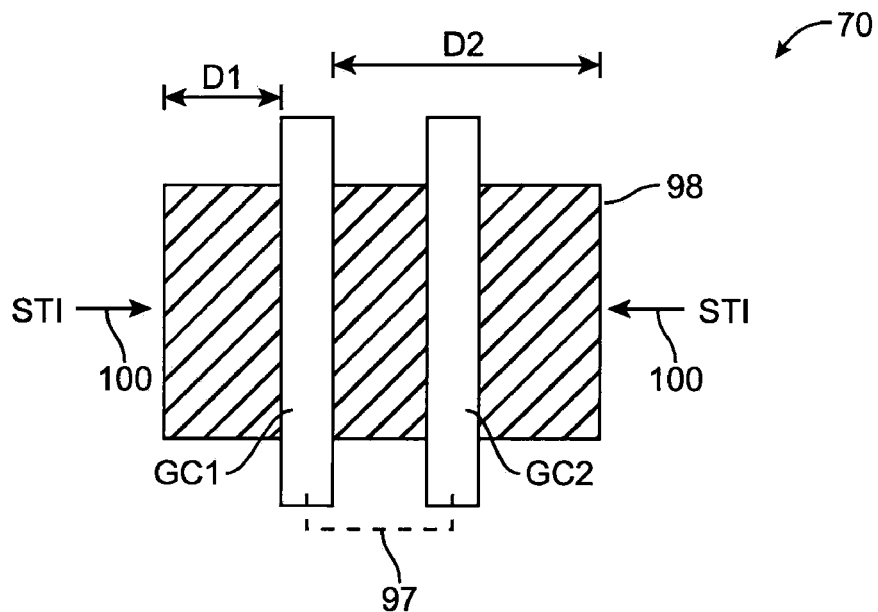
FIG. 11A is a top layout view of an illustrative multi-finger transistor showing how shallow trench isolation (STI) features may produce stress in accordance with an embodiment of the present invention.

Transistor 70 may be formed on an integrated circuit using a multi-finger configuration, as shown in FIG. 11A. The multi-finger configuration may have at least two gates such as gate conductors GC1 and GC2. Gate conductors GC1 and GC2 may be electrically connected through path 97. Gate conductors GC1 and GC2 may be formed over a diffusion region such as diffusion region 98. Diffusion region 98 may sometimes be referred to as an active region where source-drain contacts are formed.

Gate conductor GC1 may be formed a certain distance away from the borders of diffusion region 98. Gate conductor GC1 may be a distance D1 from an adjacent border of diffusion region 98 (see, e.g., FIG. 11A). Gate conductor GC1 may be a distance D2 from a non-adjacent border of diffusion region 98. Distance D2 may be greater than distance D1. Isolation structures such as shallow trench isolation (STI) structures may be formed in regions outside of diffusion region 98. STI structures may exhibit compressive stress onto a multi-finger transistor in the directions indicated by arrows 100. For example, gate conductor GC1 may experience STI stress (i.e., compressive stress) from a distance D1 on the adjacent border and from a distance D2 on the non-adjacent border. The STI stress from the non-adjacent border may not affect gate conductor GC1 as strongly as the stress from the adjacent border. In general, STI stress has a greater impact on a gate when the corresponding diffusion region border is closer to the gate (e.g., distance D1 is smaller than distance D2). Gate conductor GC2 may also experience a similar amount of stress as gate conductor GC1, assuming the multi-finger transistor is substantially symmetrical.

Figure 11B:
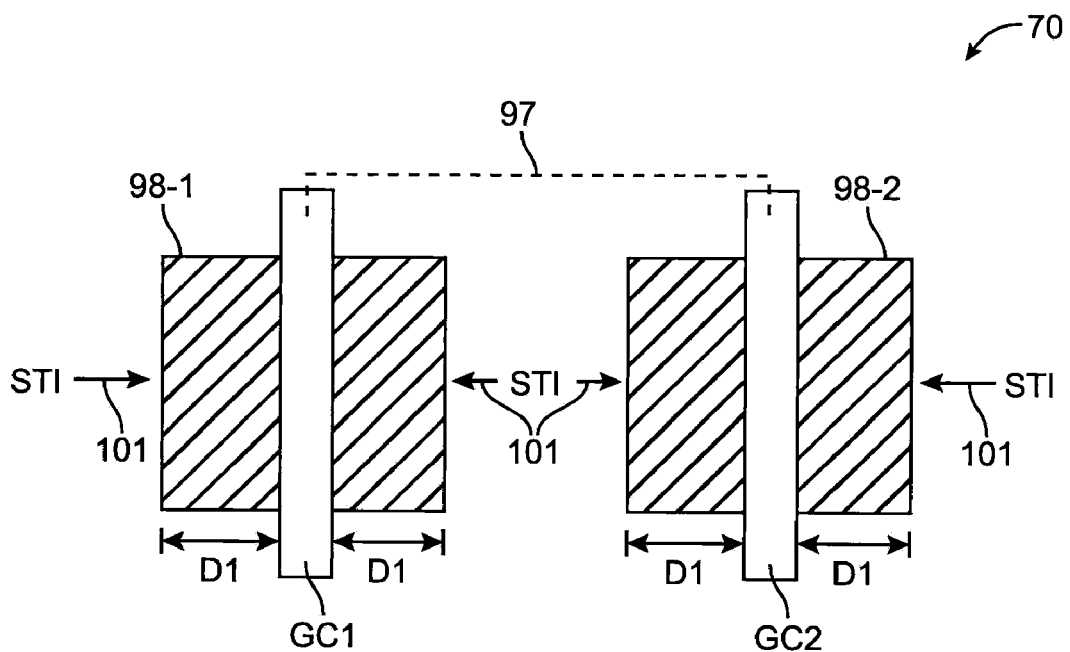
FIG. 11B is a top layout view of an illustrative single-finger transistor showing how shallow trench isolation (STI) features may produce stress in accordance with an embodiment of the present invention.

A transistor of about the same strength as the transistor of FIG. 11A may also be implemented using a single-finger (or single-gate-finger) configuration, as shown in FIG. 11B. For example, gate conductors GC1 and GC2 may be formed over two separate diffusion regions 98-1 and 98-2, respectively. Gate conductors GC1 and GC2 may likewise be electrically connected through path 97. The effective transistor gate length and transistor width are equal for the multi-finger and the single-finger implementation. In the single-finger implementation, however, gate conductor GC1 is separated from the surrounding STI region by distances D1 on both sides. Gate conductor GC1 may experience compressive STI stress from both sides, as shown by arrows 101. Gate conductor GC1 in the single-finger arrangement may therefore experience more compressive stress than gate conductor GC1 in the multi-finger arrangement of FIG. 11A, because the borders of the diffusion region in the transistor of FIG. 11B are close to the gate conductors GC1 and GC2. The borders of the diffusion region are located farther away from the gate conductors in the case of the multi-finger configuration of FIG. 11A. Gate conductor GC2 may also experience the same amount of stress as gate conductor GC1 in the single-finger arrangement. Elevated compressive stress obtained in this way may be said to exploit a length of diffusion (LOD) effect. The LOD effect may therefore be used to enhance compressive stress in a transistor (i.e., to selectively form transistors using single-finger configurations instead of multi-finger configurations).

Another way to introduce stress into a transistor involves forming source-drain diffusion regions using materials such as silicon germanium (SiGe) or silicon carbon (e.g., silicon carbide SiC). For example, it may be desirable to form the source-drain diffusion regions using silicon germanium for an NMOS transistor. Because germanium is a larger element than silicon, source-drain diffusion regions formed using silicon germanium may push outwards against the silicon substrate on which the diffusions regions are formed to provide compressive stress in the channel of the device. It may also be desirable to form the source-drain regions using silicon carbon for a PMOS transistor. Because carbon is a smaller element than silicon, forming the source-drain regions from a mixture of silicon and carbon reduces inward stress on the channel and imparts a net tensile stress along the length of the channel. These examples are merely illustrative. Any transistor (e.g., NMOS or PMOS transistors) may have source-drain diffusion regions formed using silicon germanium, silicon carbon, standard silicon, etc.

The effects of the stress-inducing techniques described above, when applied to a transistor, may be cumulative. For example, a transistor formed using a compressive stress-inducing layer, a compressive stress liner, and silicon germanium (for the diffusion regions) may exhibit a combined compressive stress that is equal to the sum of the stress provided by each of the three respective techniques.

In a scenario in which a transistor experiences different types of stress, the type of stress with the larger impact may determine the net behavior of the transistor. For example, a transistor having silicon germanium diffusion regions may have a tensile stress liner formed over its gate conductor. The transistor may experience tensile stress from the tensile stress liner and compressive stress from the silicon germanium diffusion regions. The tensile stress provided by the tensile stress liner may be less than the compressive stress provided by the silicon germanium diffusion regions (as an example). The combination of these opposing effects may provide the transistor with a net stress. The net stress experience by the transistor in this scenario may be compressive, because the compressive stress overpowers the tensile stress.

In general, the techniques described herein (e.g., stress memorization techniques, stress liners, argon implantation, LOD effect techniques, the use of diffusion regions formed using different elements, etc.) may be used to selectively adjust the amount of stress by any suitable amount. If desired, any combination of these techniques may be used to provide a transistor with more compressive stress, more tensile stress, less compressive stress, or less tensile stress.

Figure 12:
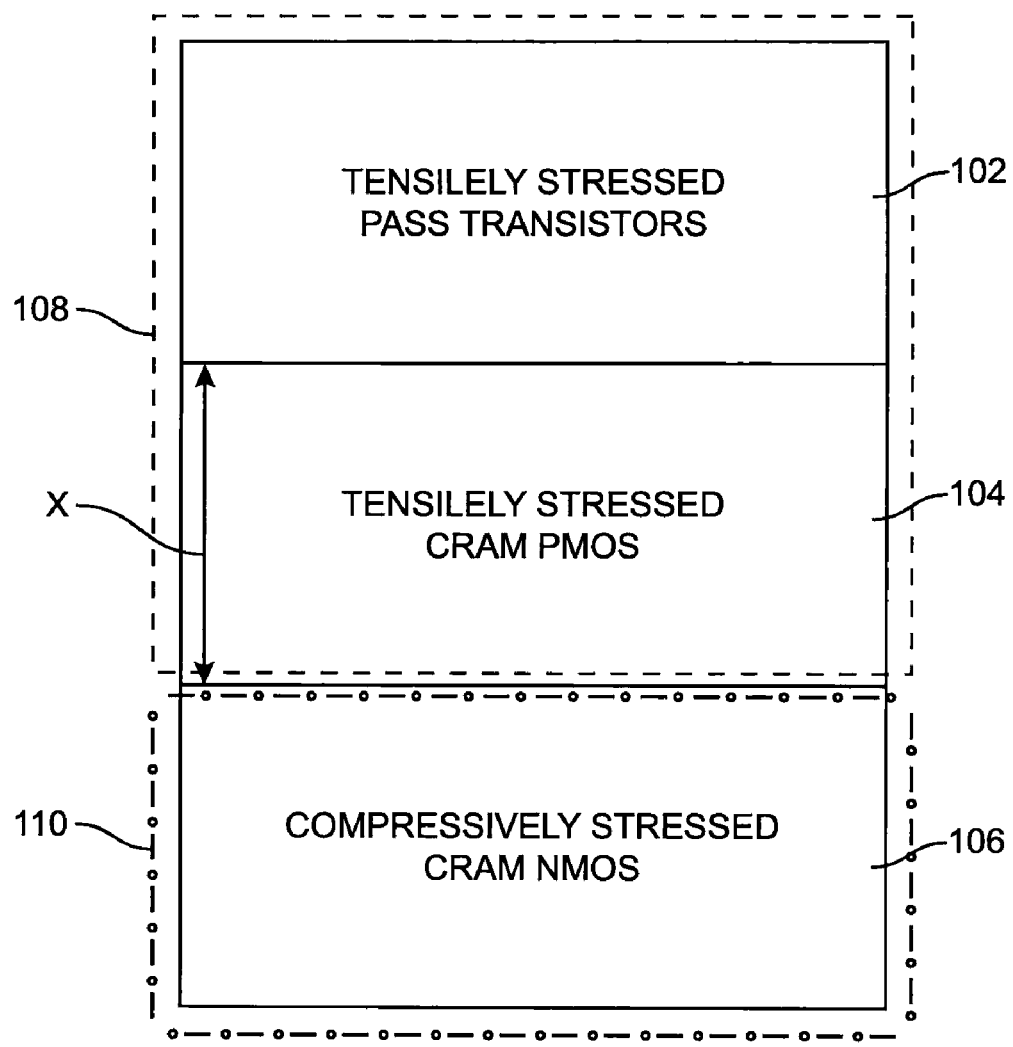
FIG. 12 is a top view of an illustrative memory cell with stress liners in accordance with an embodiment of the present invention.

FIG. 12 shows a top layout view of a CRAM cell of the type described in connection with FIG. 3. Tensilely stressed pass transistors including pass transistor 64 of FIG. 3 may be formed in region 102. Tensilely stressed CRAM PMOS transistors (see, e.g., transistors 48 and 54 of FIG. 3) may be formed in region 104. Region 104 may be immediately adjacent to region 102. Compressively stressed CRAM NMOS transistors (see, e.g., transistors 50, 56, 58, and 60 of FIG. 3) may be formed in region 106. Region 106 may be immediately adjacent to region 104, as shown in FIG. 12. With this type of arrangement, CRAM cells (memory elements 20 of FIG. 1) may exhibit minimized leakage current and acceptable performance, even at advanced technology nodes.

There may be a tensile stress liner such as tensile stress liner 108 formed over regions 102 and 104. There may be a compressive stress liner such as compressive stress liner 110 formed over region 106. Tensilely stressed CRAM PMOS transistors formed in this way may have reduced total leakage at the cost of somewhat degraded switching speed performance (e.g., reduced saturation current Idsat). Similarly, compressively stressed CRAM NMOS formed in this configuration may have reduced total leakage at the cost of somewhat increased delay.

Tensilely stressed pass transistors formed in this way, however, may have enhanced switching speed performance, because the pass transistors are NMOS transistors, and NMOS transistors exhibit increased saturation current when provided with tensile stress. The nearest opposing stress liner (i.e., compressive stress liner 110) may also be located at distance X away from region 102, which further enhances the performance. In general, a larger distance X will provide more performance improvement. Distance X may approximately equal to the width of region 104, as shown in FIG. 12.

FIG. 12 merely serves to show a desired type of stress for each region. The net stress experienced by each region may be different in practice. For example, it may be desirable for the transistors in region 104 to be tensilely stressed, as shown in FIG. 12. In practice, however, the transistors in region 104 may experience a net compressive stress. Techniques that introduce tensile stress may, however, be implemented to at least somewhat reduce the amount of compressive stress experienced by the transistors in region 104 (as an example). Similarly, it may be desirable for the transistors in region 106 to be as compressively stressed as possible for total leakage reduction purposes. In practice, however, the transistors in region 106 may experience a net tensile stress. Techniques that introduce compressive stress may be implemented to make the transistors in region 106 less tensilely stressed.

Figure 13:
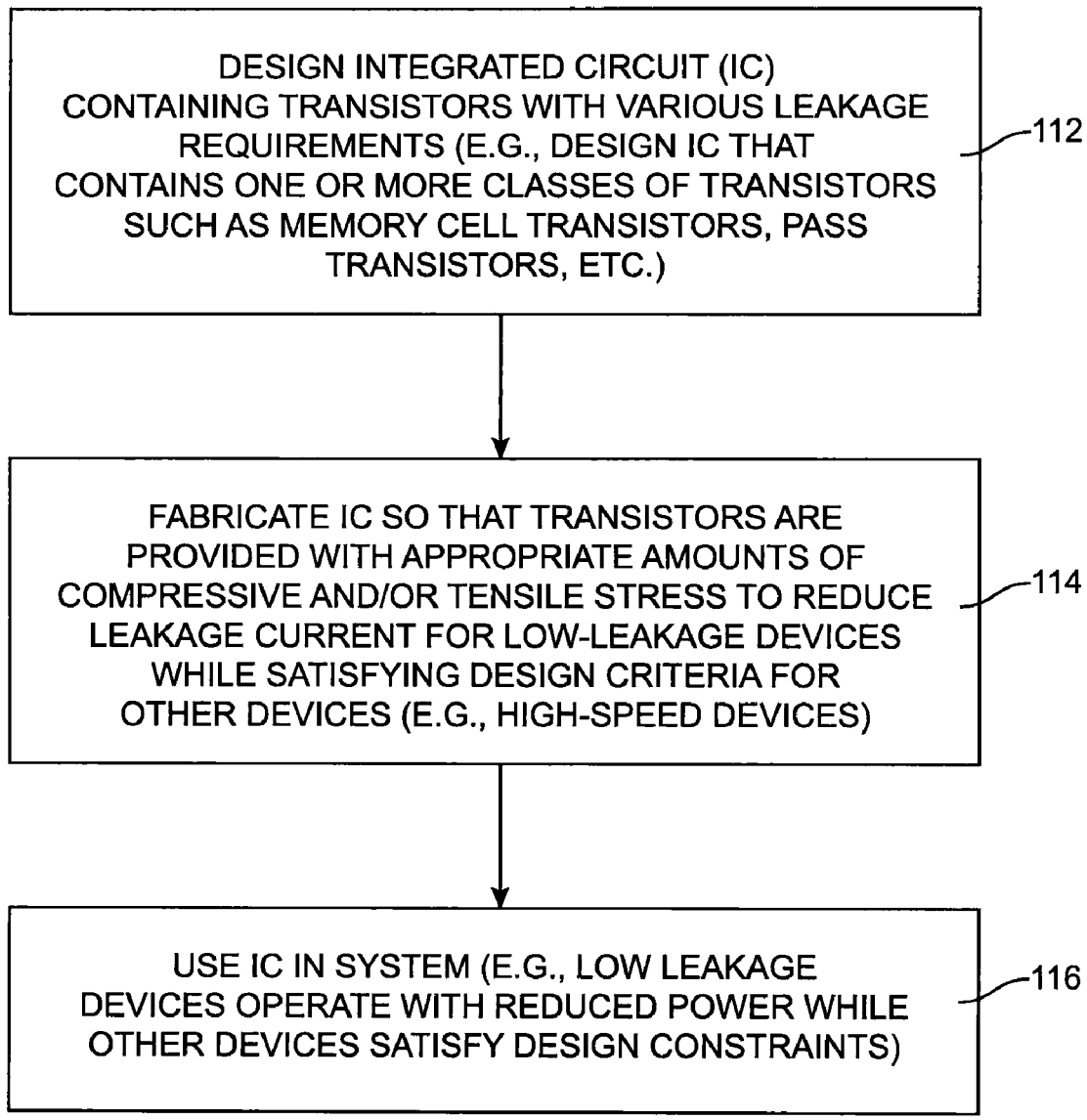
FIG. 13 is a flow chart of illustrative steps involved in forming an integrated circuit with stressed transistors in accordance with an embodiment of the present invention.

FIG. 13 is a flow chart of illustrative steps involved in forming an integrated circuit such as integrated circuit 10 with stressed transistors. At step 112, an integrated circuit (IC) may be designed such that the integrated circuit contains transistors with various leakage current requirements. For example, there may be a group of transistors such as pass transistors in a programmable integrated circuit. It may be desired to make the group of pass transistors have high saturation currents to satisfy design criteria. Leakage currents may not be a primary concern when designing such transistors.

There may be another group of transistors such as memory cell transistors that have stricter leakage current requirements. For example, speed may not be a primary concern for memory cell transistors (e.g., CRAM cells in a programmable integrated circuit). A typical integrated circuit may have thousands or millions of memory cell transistors. Even if the leakage current contributed by an individual memory cell is small, the aggregate leakage current of all the memory cells may be substantial and may consume an undesirable amount of power. It may therefore be desirable to minimize total leakage currents for memory cell transistors to lower power consumption for integrated circuits. Particularly in environments in which the memory cells are typically operated in a static mode (e.g., holding CRAM data), resulting decreases in switching speed performance may be acceptable.

Pass transistors and memory cells are merely examples representing various classes of transistors having different design requirements. A typical integrated circuit may contain these different classes of transistors. It may be desirable when fabricating this type of integrated circuit to form transistors with appropriate amounts of compressive and/or tensile stress to reduce leakage current for low-leakage devices while satisfying design criteria for other high-speed devices (step 114).

For example, consider a scenario in which it is desirable to form an NMOS transistor with a high saturation current. It may be appropriate to tensilely stress the NMOS transistor. Techniques that provide tensile stress for an NMOS transistor may include the stress memorization technique (i.e., through the use of a tensile stress-inducing layer), forming a tensile stress liner, forming source-drain diffusion regions using silicon carbide, etc. Any one technique or a combination of these techniques may be used to enhance the performance of an NMOS transistor, if desired.

Consider another scenario in which it is desirable to from a low-leakage NMOS transistor. It may be appropriate to compressively stress the NMOS transistor. Techniques that provide compressive stress for an NMOS transistor may include the stress memorization technique (i.e., through the use of a compressive stress-inducing layer), forming a compressive stress liner, forming diffusion active regions using silicon germanium or standard silicon, taking advantage of the LOD effect (i.e., by implementing transistors in single-finger instead of multi-finger configurations), etc. If desired, any one technique or a combination of these techniques may be used to reduce the leakage current of an NMOS transistor.

Such NMOS transistors may be formed using silicon carbon in the source-drain diffusion regions. The use of silicon carbon may place the NMOS transistor in a state in which the transistor channel experiences a net tensile stress along its length. In this case, it may be desirable to perform ion implantation if a tensile stress liner is present or to use a combination of the techniques that introduce compressive stress to make the NMOS transistor experience less net tensile stress. Making an NMOS transistor less tensile in this way may result in reductions in the total leakage current.

Consider another scenario in which it is desirable to make a PMOS transistor exhibit reduced leakage currents. It may be appropriate to tensilely stress the PMOS transistor. Any technique or combinations of techniques that can introduce tensile stress may be used to reduce the leakage current of a PMOS transistor.

Such PMOS transistors may sometimes be formed using silicon germanium in the active regions. The use of silicon germanium may place the PMOS transistor in a state in which the transistor experience a net compressive stress. In this case, it may be desirable to perform ion implantation to relax the compressive stress if a compressive stress liner exists or to perform a combination of the techniques that introduce tensile stress to make the PMOS transistor experience less net compressive stress. Making a PMOS transistor less compressive in this way may lower the total leakage current.

Once the integrated circuit has been fabricated, it can be used in a system to provide desired functionality (step 116). Because the different types of transistors are provided with appropriate amounts of stress, performance-critical transistors such as pass transistors may satisfy design constraints while low leakage devices such as memory cell transistors may operate with reduced power (as an example).

The foregoing is merely illustrative of the principles of this invention and various modifications can be made by those skilled in the art without departing from the scope and spirit of the invention.

What is claimed is:

1. An integrated circuit comprising:
   a memory cell formed from compressively stressed n-channel transistors each having a first total leakage current, wherein the memory cell has an output at which a static output signal is provided; and
   a tensilely stressed n-channel pass transistor having a second total leakage current that exceeds the first total leakage current, wherein the tensilely stressed n-channel pass transistor has a gate operable to receive the static output signal.

2. The integrated circuit defined in claim 1 further comprising a stress liner covering the compressively stressed n-channel transistors that imparts compressive stress to the compressively stressed n-channel transistors, wherein the second total leakage current includes a first source-drain leakage current and a first bulk leakage current and wherein the first total leakage current includes a second source-drain leakage current and a second bulk leakage current.

3. The integrated circuit defined in claim 2, wherein the stress liner is configured so that the first and second source-drain leakage currents are equal and so that the second bulk-leakage current is at least a factor of ten less than the first bulk-leakage current.

4. The integrated circuit defined in claim 3, wherein the tensilely stressed n-channel pass transistors has a first saturation current, wherein at least one of the compressively stressed n-channel transistors has a second saturation current, and wherein the stress liner is configured so that the first saturation current is greater than the second saturation current.

5. The integrated circuit defined in claim 1 further comprising:
   a compressive stress liner formed over the compressively stressed n-channel transistors; and
   a tensile stress liner formed over the tensilely stressed n-channel pass transistors.

6. An integrated circuit comprising:
   a plurality of n-channel memory cell transistors;
   a compressive stress liner formed over the plurality of n-channel memory cell transistors;

a plurality of tensilely stressed n-channel pass transistors each of which has a gate operable to receive a static output signal from a respective one of the plurality of n-channel memory cell transistors; and a tensile stress liner formed over the plurality of tensilely stressed n-channel pass transistors.

7. The integrated circuit defined in claim 6, wherein the n-channel memory cell transistors have source-drain diffusion regions formed using silicon germanium.

8. The integrated circuit defined in claim 6, wherein the n-channel memory cell transistors have source-drain diffusion regions formed from silicon without germanium.

9. The integrated circuit defined in claim 6, wherein the n-channel memory cell transistors comprise single-gate-finger transistors that experience compressive stress from shallow trench isolation structures.

10. An integrated circuit comprising:

a plurality of compressively stressed n-channel metal-oxide-semiconductor (NMOS) transistors that have channels with lengths and that are compressively stressed along their lengths; and a plurality of tensilely stressed p-channel metal-oxide-semiconductor (PMOS) transistors that have channels with lengths and that are tensilely stressed along their lengths.

11. The integrated circuit defined in claim 10, further comprising:

a plurality of tensilely stressed NMOS transistors that have channels with lengths and that are tensilely stressed along their lengths.

12. The integrated circuit defined in claim 11, wherein the tensilely stressed NMOS transistors comprise programmable logic pass transistors that form programmable logic circuitry on the integrated circuit.

13. The integrated circuit defined in claim 12, wherein the compressively stressed NMOS transistors and the tensilely stressed PMOS transistors are connected to form cross-coupled inverters in a memory cell.

14. The integrated circuit defined in claim 13, wherein the tensilely stressed PMOS transistors in the memory cell are located adjacent to the programmable logic pass transistors and wherein the compressively stressed NMOS transistors in the memory cell are located adjacent to the tensilely stressed PMOS transistors.

15. The integrated circuit defined in claim 14, wherein the memory cell has an output that provides a static control signal to the pass transistors in the logic circuitry.

16. The integrated circuit defined in claim 10, wherein the compressively stressed NMOS transistors comprise memory cell transistors.

17. The integrated circuit defined in claim 10, wherein the tensilely stressed PMOS transistors comprise memory cell transistors.

* * * * *